(12) United States Patent
Kandler

(10) Patent No.: US 11,199,588 B2
(45) Date of Patent: Dec. 14, 2021

(54) CHARACTERIZATION OF AN ELECTROCHEMICAL DEVICE IN OPERATION FOR A FUTURE FUNCTIONING PROGNOSIS OF THE DEVICE

(71) Applicant: ELECTRICITE DE FRANCE, Paris (FR)

(72) Inventor: Christoph Kandler, Kronau (DE)

(73) Assignee: ELECTRICITE DE FRANCE, Paris (FR)

( * ) Notice: Subject to any disclaimer, the term of this patent is extended or adjusted under 35 U.S.C. 154(b) by 277 days.

(21) Appl. No.: 16/471,794

(22) PCT Filed: Dec. 18, 2017

(86) PCT No.: PCT/EP2017/083400
§ 371 (c)(1),
(2) Date: Jun. 20, 2019

(87) PCT Pub. No.: WO2018/114860
PCT Pub. Date: Jun. 28, 2018

(65) Prior Publication Data
US 2020/0116793 A1    Apr. 16, 2020

(30) Foreign Application Priority Data
Dec. 22, 2016 (FR) ..................... 16 63122

(51) Int. Cl.
*G01R 31/367* (2019.01)
*G01R 31/392* (2019.01)
(Continued)

(52) U.S. Cl.
CPC ......... *G01R 31/367* (2019.01); *G01R 31/382* (2019.01); *G01R 31/392* (2019.01); *G06N 7/005* (2013.01); *G06N 20/00* (2019.01)

(58) Field of Classification Search
None
See application file for complete search history.

(56) References Cited

U.S. PATENT DOCUMENTS

2006/0284600 A1    12/2006    Verbrugge
2011/0196633 A1    8/2011    Abe et al.
(Continued)

FOREIGN PATENT DOCUMENTS

| JP | 2005-331482 A | 12/2005 |
| JP | 2007-005304 A | 1/2007 |
| JP | 2013-543238 A | 11/2013 |

OTHER PUBLICATIONS

Zhang (Health Monitoring and Prognostic of Li-ion Battery, 2010, University of Cincinnati, Dept. of Mechanic Engineering of the College of Engineering and Applied Science) (Year: 2010).*

(Continued)

*Primary Examiner* — Roy Y Yi
(74) *Attorney, Agent, or Firm* — Faegre Drinker Biddle & Reath LLP

(57) ABSTRACT

A characterization of an electrochemical device in operation for a future functioning prognosis of the device with, in particular: a storage in memory, for a given device type, of a plurality of variation models over time of at least one functioning parameter of the device, according to respective operation points of the device, and the implementation of a processor accessing this memory and comprising at least one connection to the device to: obtain an item of information relating to a current operation point of the device, recover in the memory, at least one variation model corresponding to the current operation point of the device, receive from the device, at least one measurement of a current value of the functioning parameter, compare said measurement to the variation model recovered from the memory, to temporarily (Continued)

locate the functioning of the device, and, from there, estimate a functioning prognosis of the device.

13 Claims, 4 Drawing Sheets

(51) Int. Cl.
*G06N 20/00* (2019.01)
*G01R 31/382* (2019.01)
*G06N 7/00* (2006.01)

(56) References Cited

U.S. PATENT DOCUMENTS

| | | |
|---|---|---|
| 2012/0098481 A1 | 4/2012 | Hunter et al. |
| 2014/0214348 A1 | 7/2014 | Sahinoglu et al. |
| 2014/0244193 A1 | 8/2014 | Balasingam et al. |
| 2015/0046108 A1 | 2/2015 | Akamine |
| 2016/0041231 A1 | 2/2016 | Lee |
| 2016/0202324 A1 | 7/2016 | Biletska et al. |

OTHER PUBLICATIONS

Shin et al. ("A statistical model of cell-to-cell variation in Li-ion batteries for system-level design," International Symposium on Low Power Electronics and Design (ISLPED), 2013, pp. 94-99) (Year: 2013).*

Office Action issued in related application JP 2019-534352, dated Sep. 23, 2020, with machine generated English language translation, 6 pages.

* cited by examiner

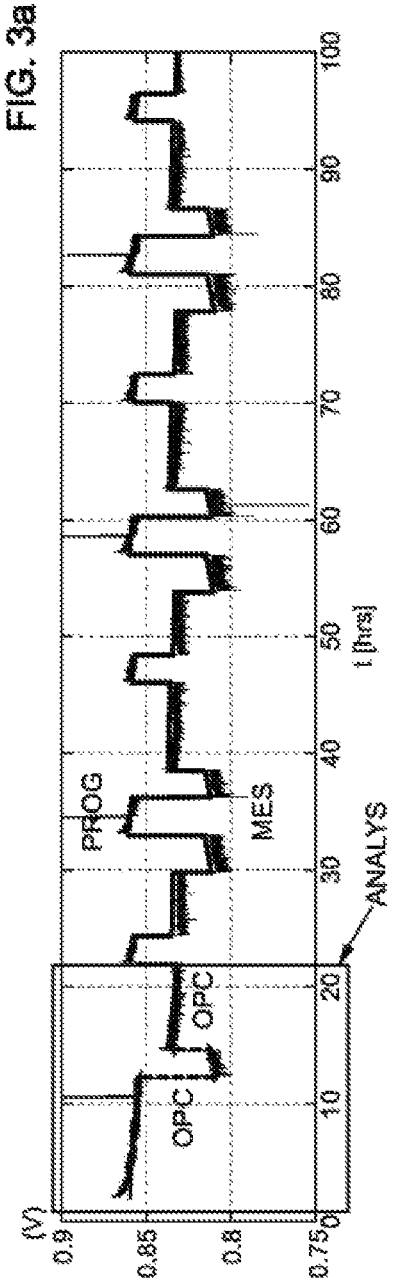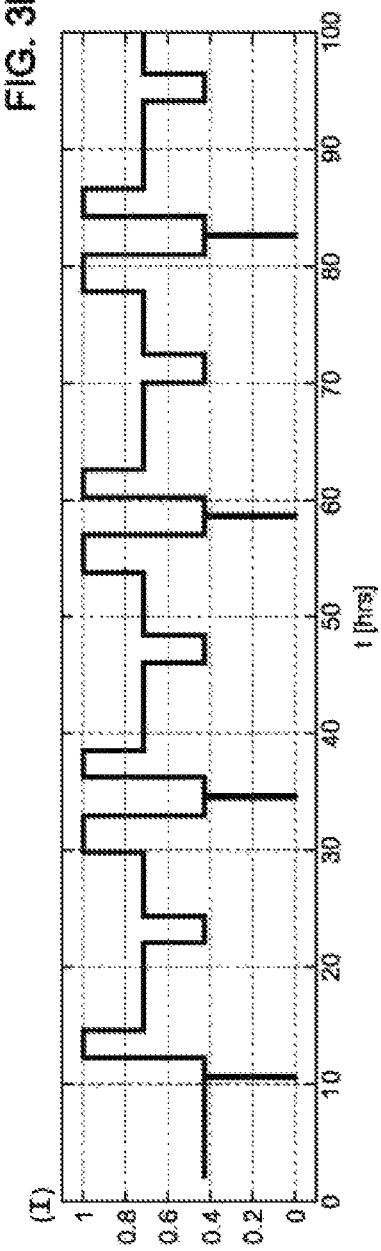

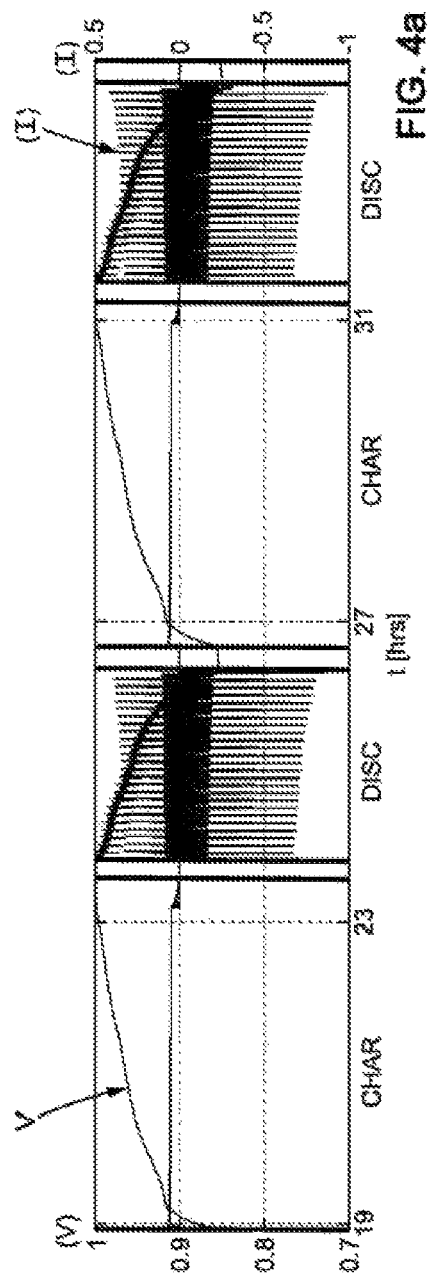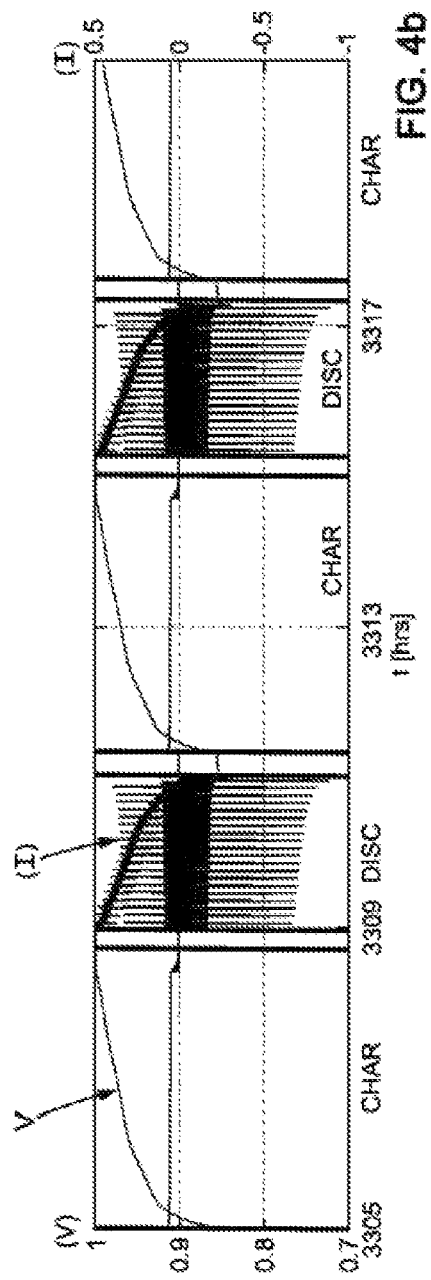

CHARACTERIZATION OF AN ELECTROCHEMICAL DEVICE IN OPERATION FOR A FUTURE FUNCTIONING PROGNOSIS OF THE DEVICE

CROSS-REFERENCE TO RELATED APPLICATIONS

This application is the U.S. national phase of the International Patent Application No. PCT/EP2017/083400 filed Dec. 18, 2017, which claims the benefit of French Application No. 16 63122 filed Dec. 22, 2016, the entire content of which is incorporated herein by reference.

FIELD

The disclosure relates to electrochemical devices, and more specifically, a prognosis method for a future functioning of such devices.

BACKGROUND

Commonly, devices such as energy sources or electrochemical converters (batteries, fuel cells, super capacities, redox batteries, or others), or also electrochemical methods using electrolyzers with or without separator and/or membrane (for electrodeposition, electroerosion, electroflotation, or others), are subjected to dynamics, specific to:
each application wherein they intervene, and
same constituents of such devices.

Thus, numerous physical variables must be considered, for example the temperature, absolute or relative humidity, pressure, flows, power generated or consumed, and/or others.

Usually, these variables are coupled non-linearly, such that the change of one of them impacts the others.

The models currently used require calculation powers and/or increased memory quantities. The precision thereof can thus be proved to be low. These models can also require a great number of sensors, which are difficult to integrate in an operational device. In addition, because of the couplings and interactions between the variables and/or a functioning control member and/or the environment, the dynamic behaviors are often very difficult to consider. Furthermore, the phenomena develop quickly, and typically a permanent regime cannot be observed, quite stable over time to anticipate a prognosis initially.

The present disclosure improves the situation.

SUMMARY

To this end, it proposes a method for characterizing an electrochemical device in operation for a future functioning prognosis of the device, the method comprising:

A prior memory storage step, for a given device type, of a plurality of models of variation over time of at least one functioning parameter of the device, according to respective operation points of the device, and Current subsequent steps implemented by a processor accessing said memory and comprising at least one connection to the device to:
Obtain an item of information relating to a current operation point of the device,
Recover in the memory, at least one variation model corresponding to the current operation point of the device,
Receive from the device, at least one measurement of a current value of the functioning parameter,
Compare said measurement to the variation model recovered from the memory, to temporarily locate the functioning of the device, and, from there,
Estimate a functioning prognosis of the device.

According to an embodiment, the functioning parameter is a voltage at terminals of the device (as described below in reference to FIGS. 3a, 4a and 4b). According to an embodiment, the variation models stored in the memory comprise models for decreasing the voltage at terminals of the device according to time (as illustrated in the abovementioned figures), according to different given operation points.

According to an embodiment, the functioning prognosis is estimated according to a plurality of models stored in memory and weighted by respective weights defined according to the current operation point.

According to an embodiment, the current operation point of the device is defined according to:
at least one input variable, corresponding to a functioning parameter imposed on the electrochemical device, and
at least one output variable, corresponding to a parameter that delivers the electrochemical device, relative to the functioning thereof.

In an example of such an embodiment, the electrochemical device is capable of providing electrical energy, and thus, the input variable is a functioning current imposed on the device (as an instruction), while an output variable is the voltage that the device delivers. In an embodiment example, furthermore a correction applied to said at least one output variable is provided, according to a detection of at least one transition linked to a change of functioning point of the device.

Complementarily or in a variant, also a correction applied to said at least one output variable can be provided, according to at least one significant parameter of the device, measured by a sensor, such as a temperature, a degree of humidity of the device, or other.

In an embodiment, a remaining lifespan of the device is estimated (possibly, from among prognosis data), at least according to a current functioning point of the device. Here, by "current functioning point", this means data defining a current use of the device. Thus, the estimation of the lifespan thereof, of course, is a function of this current use (in the absence of a change of future use). This use can be determined, for example, according to an amperage that the device must deliver, or other. The notion of "current functioning point" is different from that of the abovementioned "operation point", that of "operation point" being more general. A current operation point can typically be detected from measured data (input and/or output) making it possible to establish, for example, a future charge curve. Thus, the data of a current operation point can correspond to several possible uses, which are different. It will be noted, that the remaining lifespan can be furthermore estimated according to at least two successive operation points, as will be seen below (a preceding operation point and a current operation point).

Indeed, the remaining lifespan of the device can be furthermore estimated from a current degradation speed of the device, determined by learning the behavior of the device. For example, a sliding analysis window (FIG. 3a) can make it possible to follow a degradation speed of a parameter such as the voltage that delivers the device over time. In an embodiment, furthermore a standard deviation is evaluated over time of said current value measurement of the functioning parameter, such a standard deviation advantageously quantifying a degree of functioning stress of the device, considered for an estimation of the remaining lifespan of the device.

In an embodiment, the method is implemented repetitively for a plurality of successive operation points. Thus, items of information respectively relative to said successive operation points of the device are obtained and stored successively in memory, such that the estimation of the functioning prognosis of the device is made not only based on the current operation point, but also on said successive operation points.

The present disclosure also aims for a module for processing data coming from an electrochemical device in operation, for a future functioning prognosis of the device, and comprising:

a memory for storing at least one plurality of variation models over time of at least one functioning parameter of the device, according to respective operation points of the device, and for a given device type, an input interface to receive from the device, at least one measurement of a current value of the functioning parameter (and possibly, by this input interface or via another interface, said information relating to a current operation point of the device, insomuch as this information cannot be derived from one or more current and/or past value measurements of the one or more functioning parameters of the device), a processor connected to the memory and to the input interface to execute the steps of the method presented above, and an output interface to deliver a functioning prognosis of the device.

Such a module is illustrated as an example in FIG. 5 (and bears the reference MOT there).

The present disclosure also aims for a computer program comprising instructions for the implementation of the method presented above, when this program is executed by a processor.

As an example, FIG. 1 presents a possible flowchart of the general algorithm of such a program. FIG. 2 illustrates the possible flowchart of a detail of the algorithm which relates to possible additional considerations for the estimation of the remaining lifespan of the device.

Thus, the disclosure makes it possible to produce a model for prognosing or estimating the remaining lifespan for each functioning point of an electrochemical device, implementing a separation between the dynamics and the stationary functioning regimes, as detailed below.

This separation is conveyed by different simplified functioning models in a permanent regime. The complex dynamic behaviors, useless and/or damaging for the prognosis or the estimation of the remaining lifespan of these devices, can be analyzed and corrected.

The parameterization of these multiple models can be automated as the use of one single or of only a few of these models is sufficient, thus reducing the necessary calculation power, for the estimation of a prognosis or of the remaining lifespan of an electrochemical device.

According to an approach of the disclosure, several models are used, rather than one single model which would be larger and complex, in order to decompose the non-linear effects in sub-portions which can be more easily manipulated.

BRIEF DESCRIPTION OF THE DRAWINGS

Other advantages and characteristics of the disclosure will appear upon reading the description of embodiment examples detailed below, and upon examining the appended drawings, wherein:

FIGS. 3a and 3b present the time variations respectively in voltage (V) and in current (I), by thus changing the successive operation points OPC of the functioning of a fuel cell in the example represented; in particular, FIG. 3a compares the voltage predicted by prognosis PROG to the voltage actually measured MES, FIGS. 4a and 4b present the variations in voltage (V) and in current (I), in the course of charges CHAR and of discharges DISC of a rechargeable battery in the example represented, respectively for the first hours of use and after more than 3300 hours of use.

DETAILED DESCRIPTION

In reference to FIG. 1, a decomposition of a prognosis system is provided, as follows:

multiple models MPF1, MPF2, . . . , MPFk, for each functioning point considered, a supervision module SUP, a correction module COR of one or more output variables of the system VO, as described below, and a module for estimating, finally, the remaining lifespan DVE of the electrochemical device.

Figure 1:
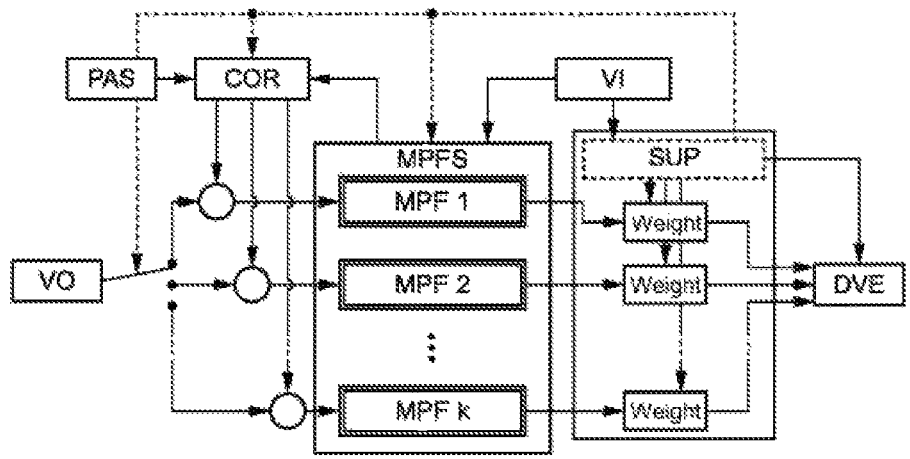
FIG. 1 presents a general algorithmic approach example of a method in the sense of the disclosure.

It is possible to manage a non-linear system by separating the functioning thereof in different regimes, as illustrated in FIG. 1 (different functioning point models).

The different levels of the input variable(s) can be considered as functioning points. It can be considered as they are fixed at new constants, but different for each functioning point. The input variable(s) considered is/are used as the main criterion/criteria for selecting the model to be used.

Thus, each functioning point is associated with a specific model, given to estimate an aging speed of the device, but it has however proved to be that all these models have a comparable structure, hence the interest in the approach of the disclosure.

The supervision module can fix the weight (between 0 and 1) to be applied to the different models, for purposes of optimization. The input(s) of each model is/are fixed by the supervision model. Moreover, each model uses at least one variable coming from an output of the device, this variable being selected such that it is associated with the functioning point thereof. Each model contains at least one processing of this variable (for example, the calculation of the standard deviation within a sliding window of the variable considered), as well as the current degradation speed (as presented below). It also contains a module for processing the transitions linked to a change of the functioning point, and a module estimating a present degree of stress, as well as the history thereof.

The output variable(s) must be regulated and only depend on at least one input variable, however by taking the precaution that this dependency is not linked to a regulation loop that can implement a supervision module to control the functioning of the electrochemical device. These elements are used to determine the degradation speed of the latter in order to estimate the remaining lifespan thereof. Thus, the supervision module can inform the module for estimating the lifespan, of a profile of the current functioning of the device, and more specifically of the current functioning point of the device. Another task of the supervision model is to select the functioning point model to be used and to inform of the current transition type, in order to correct at least one of the output variables of the system illustrated in FIG. 1 (via discreet event models and via the correction of significant parameters, as described in detail below). These parameters typically represent the impact, often greater than that of aging, of the environment on the output variables of the system.

In an embodiment, a correction of the output variables of the system is proceeded with, in order to remove the damaging effects of a given output signal, on the aging of certain variables, and the abovementioned transitions, to be focalized rather on the different operating conditions associated with the different input variables.

The transmission duration between two functioning points can be very short with respect to that of a functioning point, but this transition can have an effect that is a lot greater on the output variables, than the aging itself. In order to resolve this problem, "discreet event models" are used to correct the output variables. These models are only used during a transition event. The end of a transition of one or more input variables is used to trigger the execution of the model. Then, the supervision module can correct the value of the output variable at the input of the functioning point model. Thus, the effects of the transitions can be removed to quantify the effect of the aging. When a new permanent regime is reached, the discreet event model is deactivated until the next change of functioning point.

Due to the non-linear character of electrochemical devices, each functioning point model uses a set of parameters, specific, at the input of the discreet event model. Indeed, the response to a slot or a ramp differs according to the current levels and precede one or more input variables of the system. To affect a suitable discreet event model to the correction of the output variables, the supervision module informs the functioning point model of the transition type achieved and levels of input variable(s) from which this transition has started.

Figure 2:
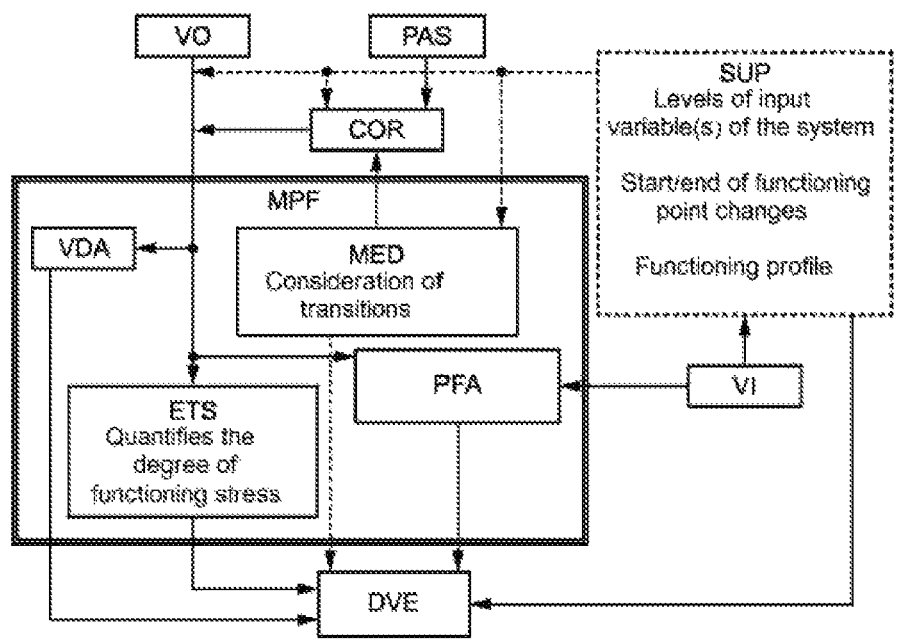
FIG. 2 presents in more detail, the principle and the structure of a model used for a given functioning point MPF, as well as its interaction sub-assemblies with a supervision module SUP, by thus illustrating the signal paths processed and the manner of which the supervision module can tilt between the different models in case of change of functioning point.

Moreover, different parameters (for example, the temperature) can have more significant effects on the output variables, than the aging itself. These parameters are therefore corrected before being used at the input of the functioning point model. FIG. 2 illustratively presents information that each functioning point model sends a prediction of remaining lifespan to the module, in order to estimate the output variable value(s) according to the profile of the input variable(s).

More specifically, from input variables of the system VI, a functioning point model MPF can determined a current functioning point PFA, in view of estimating the remaining lifespan DVE on the electrochemical device. However, this estimation is refined by information that the supervision module SUP can deliver, capable of defining, in particular:
  levels of input variables VI,
  a start and an end of functioning point change(s),
  a functioning profile,
  and/or others.

This information can be transmitted to a discreet event model MED for the consideration of the transitions (integrated in the functioning point model MPF in the example illustrated in FIG. 2). Thus, this discreet event model MED can correct the interpretation of the output variables of the system VO (as well as other possible significant parameters PAS, like the temperature, for example), in order to define more specifically, in particular:
  the current functioning point PFA, and
  the current degradation speed VDA.

From these estimations of the current functioning point PFA and of the degradation speed VDA, and possibly of a standard deviation ETS quantifying a degree of stress of the device in functioning as will be seen below, it is possible to refine the estimation of the remaining lifespan DVE, in particular in the case of a functioning transition.

For example, in the case of a fuel cell, the following function can be used: $SOV_{est} = m_{age} \times SIV(t_{seq}) + SOV_{act}$, where:
  $SOV_{est}$ and $SOV_{act}$ correspond to the values respectively estimated and measured of an output variable,
  $SIV(t_{seq})$ corresponds to the expected profile of an input variable considered (as well as the duration thereof, $t_{seq}$ representing time), and
  $m_{age}$ corresponds to the degradation speed.

This degradation speed $m_{age}$ can be determined by learning by making several successive estimations (for example, of prognoses) based on a succession of respective operation points, of which the data has been able to be commonly recovered and stored in memory, and this by repetitively implementing the method in the sense of the disclosure with a plurality of successive operation points.

As the output variable(s) of the system are in a permanent regime, the degradation speed is supposed constant until the end of life of the electrochemical device. If the operational conditions change, however, the lifespan estimation considers this change to estimate again the degradation speed and the lifespan of the device under the new functioning conditions thereof.

The aging is linked to the functioning conditions of the electrochemical device and to the different variables thereof. If it functions under normal conditions or to relatively non-stressing functioning points, the device ages slower and this observation is considered for the estimation of the remaining lifespan. In addition, the degradation speed can be heterogenous within the device. These aspects are considered by the approach by multiple models: each functioning model corresponds to a different level of the input variables of the system and considers the degradation speed thereof.

Of course, the signal(s) which come(s) from the device fall into the current conditions thereof. The evolutions of the output variables of a functioning device under stressing conditions can, for example, be noisier. Also, these variables have an increase sliding standard deviation ETS and the value of this standard deviation can represent a stability criterion of the device.

Preferably, a learning phase is provided in order to experience at least once, each functioning point and each change between two functioning points, so as to assign to corresponding degradation speeds and to determine the corrections to be applied.

Now, FIG. 3a is referred to. It represents, in the example described, the behavior of a fuel cell, in voltage, in the course of the use thereof. It appears that on a use instruction of the cell, that indicates directly the current (I), it is possible to establish the definition of one or more successive operation point(s) OPC. Here, the voltage (V) is one of the output variables and the instruction value given by the current (I) can be one of the input variables of the model. Like the reaction of such an electrochemical device to a given instruction is specific to the nature and to the same constituents of the device, an observation window ANALYS of this behavior is advantageously provided in the first cycle hours, in the example represented. Thus, the analysis of the behavior of the voltage (V) in these different operation points (window ANALYS) makes it possible to determine a prognosis PROG, under similar operation conditions, however considering a decrease in voltage (V) inherent to the successive use cycles over time t (here, counted in hours). Of course, this prognosis can be furthermore estimated according to the functioning points identified and determined above, possibly in prior analysis windows. However, in the example represented, the voltage decrease model PROG follows the variations of voltage actually measured MES over time. Actually, it will be noted, that the model PROG follows the three levels of voltage variation, imposed by the three current (I) values (outside of the zero value, of course). Also, it can be noted, in the example illustrated, that the standard deviation in the variation in the voltage (V) increases over time. This observation is furthermore useful to estimate the decrease in voltage according to time.

A slight difference can possibly be observed, at the end of an increased number of hours, between the prognosis value and the value actually measured (the latter could be slightly less than that measured). This observation is thus inherent to the electrochemical device, itself, and to the specific aging of the components thereof, in the use environment thereof. In this case, it can be useful to correct the prognosis value for the future behavior of the device, to make this estimation compliant with the present observation.

Now, FIGS. 4a and 4b are referred to, to observe an application of the disclosure, for another type of electrochemical device, here a rechargeable battery. It is observed, for example, that the durations of complete charge CHAR and complete discharge DISC (each charge and discharge event defining a functioning point as such) increase in the course of charge/discharge cycles. Thus, already, the duration of a complete discharge or of a complete charge is a prognosis index of the remaining lifespan of such an electrochemical device. Moreover, the behavior of the device during successive use cycles (during discharge DISC periods) can furthermore be observed. In this case, a fine observation of the voltage (V) behavior relative to the current (I) can also give, as described above, an estimation of the remaining lifespan of the battery.

Figure 5:
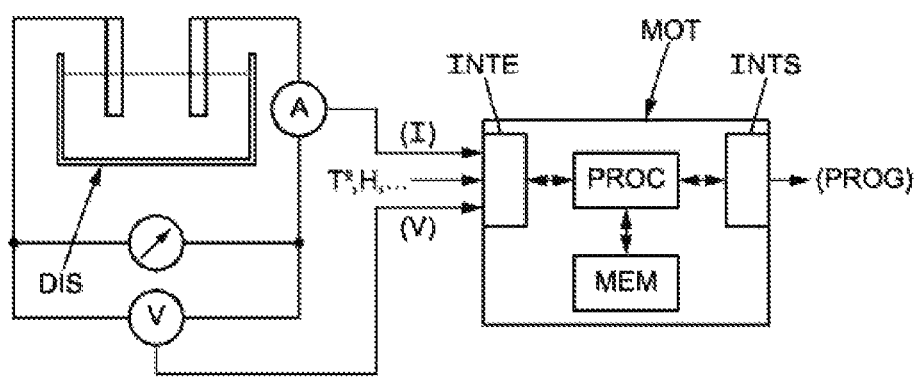
FIG. 5 illustrates a processing, physical (hardware) module example, for the implementation of the disclosure.

In reference to FIG. 5, a processing module MOT for the implementation of the disclosure can comprise an input interface INTE, in order to receive several signals coming from the monitored electrochemical device DIS, of which, in particular:
    an instruction for controlling the device DIS, such as the current (I) that it must supply for example, as an input variable of the abovementioned system,
    a functioning variable of the device DIS, such as the voltage at the terminals thereof (V), as an output variable of the system, and
    possibly one or more signal(s) coming from sensors arranged in the electrochemical device DIS, such as for example, a temperature T° measurement, a degree of humidity H measurement, and/or others.

The processing module MOT further comprises a processor PROC to process this data, as well as a memory MEM to store temporary calculation data, as well as durable data such as instructions of a computer program for the implementation of the method according to the disclosure, and, of course, the data from the models associated with each functioning point.

The processing module MOT further comprises an output interface INTS to deliver a prognosis PROG signal, and possibly remaining lifespan, estimated, of the electrochemical device DIS. Of course, this signal PROG can provide a man-machine interface (not represented, such as a screen or other) to inform a user of a remaining lifespan, if necessary.

The invention claimed is:

1. A method for characterizing an electrochemical device in operation for a future functioning prognosis of the device, comprising:
    storing in memory, for a given device type, a plurality of variation models over time of at least one functioning parameter of the device, according to the respective operation points of the device, and
    accessing said memory by a processor comprising at least one connection to the device to:
        obtain an item of information relating to a current operation point of the device,
        recover in the memory, at least one variation model corresponding to the current operation point of the device,
        receive from the device, at least one measurement of a current value of the functioning parameter,
        compare said measurement to the variation model recovered from the memory, to temporarily locate the functioning of the device, and, from there,
        estimate a functioning prognosis of the device,
    wherein said current operation point of the device is defined according to:
    at least one input variable, corresponding to a functioning parameter imposed on the electrochemical device, and
    at least one output variable, corresponding to a parameter that the electrochemical device delivers, relative to the functioning thereof.

2. The method of claim 1, wherein the functioning parameter is a voltage at terminals of the device.

3. The method of claim 1, wherein the variation models stored in the memory comprise models for decreasing voltage at terminals of the device according to time, according to different given operation points.

4. The method of claim 1, wherein the functioning prognosis is estimated according to a plurality of models stored in memory, and weighted by respective weights defined according to the current operation point.

5. The method of claim 1, wherein, the electrochemical device being capable of supplying electrical energy, an input variable is a functioning current imposed on the device, while an output variable is a voltage at terminals of the device.

6. The method of claim 1, further comprising a correction applied to said at least one output variable, according to a detection of at least one transition linked to a change of functioning point of the device.

7. The method of claim 1, further comprising a correction applied to said at least one output variable, according to at least one significant parameter of the device, measured by a sensor, from among at least one temperature and a degree of humidity of the device.

8. The method of claim 1, wherein a remaining lifespan of the device is estimated, at least according to a current functioning point.

9. The method of claim 8, wherein the remaining lifespan of the device is furthermore estimated from a current degradation speed of the device, determined by learning behavior of the device.

10. The method of claim 1, wherein a standard deviation is furthermore evaluated over time of said current value measurement of the functioning parameter, said standard deviation quantifying a degree of functioning stress of the device, considered for an estimation of a remaining lifespan of the device.

11. A method for characterizing an electrochemical device in operation for a future functioning prognosis of the device, comprising:

storing in memory, for a given device type, a plurality of variation models over time of at least one functioning parameter of the device, according to the respective operation points of the device, and accessing said memory by a processor comprising at least one connection to the device to:

obtain an item of information relating to a current operation point of the device, recover in the memory, at least one variation model corresponding to the current operation point of the device, receive from the device, at least one measurement of a current value of the functioning parameter, compare said measurement to the variation model recovered from the memory, to temporarily locate the functioning of the device, and, from there, estimate a functioning prognosis of the device, wherein the method is implemented respectively for a plurality of successive operation points, and information respectively relative to said successive operation points of the device is obtained and stored successively in memory, and the estimation of the functioning prognosis of the device is made based on the current operation point and said successive operation points.

12. A module for processing data coming from an electrochemical device in operation, for a future functioning prognosis of the device, comprising:

a memory for storing at least one plurality of variation models over time of at least one functioning parameter of the device, according to respective operation points of the device, and for a given device type, an input interface to receive from the device, at least one measurement of a current value of the functioning parameter, a processor connected to the memory and to the input interface to:

obtain an item of information relating to a current operation point of the device, recover in the memory, at least one variation model corresponding to the current operation point of the device, receive from the device, at least one measurement of a current value of the functioning parameter, compare said measurement to the variation model recovered from the memory, to temporarily locate the functioning of the device, and, from there, estimate a functioning prognosis of the device, an output interface to deliver a functioning prognosis of the device according to a current operation point, wherein said current operation point of the device is defined according to:

at least one input variable, corresponding to a functioning parameter imposed on the electrochemical device, and at least one output variable, corresponding to a parameter that the electrochemical device delivers, relative to the functioning thereof.

13. A non-transitory computer-readable medium having stored thereon instructions for the implementation of the method of claim 1, when these instructions are executed by a processor.

* * * * *